(12) United States Patent
Kennedy et al.

(10) Patent No.: US 7,728,675 B1
(45) Date of Patent: Jun. 1, 2010

(54) FAST LOCK CIRCUIT FOR A PHASE LOCK LOOP

(75) Inventors: Ian Kennedy, Ballinlough (IE); Eugene O'Sullivan, Beara (IE); Carel J. Lombaard, Pretoria (ZA)

(73) Assignee: Cypress Semiconductor Corporation, San Jose, CA (US)

( * ) Notice: Subject to any disclaimer, the term of this patent is extended or adjusted under 35 U.S.C. 154(b) by 92 days.

(21) Appl. No.: 11/731,606

(22) Filed: Mar. 29, 2007

Related U.S. Application Data (60) Provisional application No. 60/787,862, filed on Mar. 31, 2006.

(51) Int. Cl.
  *H03L 7/087* (2006.01)
  *H03L 7/093* (2006.01)
  *H03L 7/095* (2006.01)

(52) U.S. Cl. .............................. 331/16; 331/11; 331/17; 331/DIG. 2; 327/157

(58) Field of Classification Search ............... 331/10, 331/11, 16, 17, 25, 44, DIG. 2; 327/156, 327/157, 148
See application file for complete search history.

(56) References Cited

U.S. PATENT DOCUMENTS

| | | | |
|---|---|---|---|
| 4,061,987 A | 12/1977 | Nagahama | |
| 4,378,509 A | 3/1983 | Hatchett et al. | |
| 4,492,934 A | 1/1985 | Sugimoto | |
| 4,535,459 A | 8/1985 | Hogge, Jr. | |
| 4,588,968 A | 5/1986 | Wile | |
| 4,593,254 A | 6/1986 | Coburn | |
| 4,594,564 A | 6/1986 | Yarborough, Jr. | |
| 4,773,085 A | 9/1988 | Cordell | |
| 4,855,683 A | 8/1989 | Troudet et al. | |
| 4,926,447 A | 5/1990 | Corsetto et al. | |
| 4,940,952 A | 7/1990 | Kegasa | |
| 4,943,788 A | 7/1990 | Laws et al. | |
| 5,003,599 A | 3/1991 | Landry | |
| 5,005,191 A | 4/1991 | O'Connor | |
| 5,010,559 A | 4/1991 | O'Connor | |
| 5,101,203 A | 3/1992 | Gersbach et al. | |
| 5,120,990 A | 6/1992 | Koker | |
| 5,138,281 A | 8/1992 | Boudewijns | |
| 5,175,767 A | 12/1992 | Landry | |

(Continued)

OTHER PUBLICATIONS

USPTO Notice of Allowance for U.S. Appl. No. 09/471,576 (CD99062) dated Jun. 27, 2001; 1 page.

(Continued)

*Primary Examiner*—Robert Pascal
*Assistant Examiner*—Ryan J. Johnson (57) ABSTRACT

A fast lock circuit for phase lock loop comprising a frequency detector, a phase frequency detector, a logic unit and a corresponding charge pump for the frequency and the phase frequency detectors. Embodiments of the present invention use the logic unit to relay signals from the phase frequency detector circuit to the charge pump when the PLL is in lock. The logic circuit relay signals from the frequency detector circuit before the PLL is in lock. As a result, a constant current is supplied to a large loop filter capacitor before lock. In one embodiment, additional logic circuit may be used to maximize the output current. Therefore, using the logic circuit to supply constant current charges the large loop filter capacitor continuously and avoids a slow down in charging the large loop filter. Accordingly, current is no longer wasted and the lock time is improved.

19 Claims, 7 Drawing Sheets

U.S. PATENT DOCUMENTS

| | | | |
|---|---|---|---|
| 5,301,196 A | 4/1994 | Ewen et al. | |
| 5,367,544 A | 11/1994 | Bruekheimer | |
| 5,384,551 A | 1/1995 | Kennedy et al. | |
| 5,418,497 A | 5/1995 | Martin | |
| 5,436,938 A | 7/1995 | Pigeon | |
| 5,506,875 A | 4/1996 | Nuckolls et al. | |
| 5,512,860 A | 4/1996 | Huscroft et al. | |
| 5,539,345 A | 7/1996 | Hawkins | |
| 5,548,251 A | 8/1996 | Chou et al. | |
| 5,574,756 A | 11/1996 | Jeong | |
| 5,598,424 A | 1/1997 | Erickson et al. | |
| 5,608,734 A | 3/1997 | Sandler et al. | |
| 5,614,855 A | 3/1997 | Lee et al. | |
| 5,652,531 A | 7/1997 | Co et al. | |
| 5,661,763 A | 8/1997 | Sands | |
| 5,663,665 A | 9/1997 | Wang et al. | |
| 5,666,547 A | 9/1997 | James et al. | |
| 5,671,223 A | 9/1997 | Shachar et al. | |
| 5,694,056 A | 12/1997 | Mahoney et al. | |
| 5,694,088 A | 12/1997 | Dickson | |
| 5,712,580 A | 1/1998 | Baumgartner et al. | |
| 5,719,908 A | 2/1998 | Greeff et al. | |
| 5,731,723 A | 3/1998 | Chen | |
| 5,739,709 A | 4/1998 | Banno | |
| 5,754,080 A | 5/1998 | Chen et al. | |
| 5,757,297 A | 5/1998 | Ferraiolo et al. | |
| 5,777,567 A | 7/1998 | Murata et al. | |
| 5,778,000 A | 7/1998 | Dosiere et al. | |
| 5,789,947 A | 8/1998 | Sato | |
| 5,790,607 A | 8/1998 | Burke et al. | |
| 5,799,048 A | 8/1998 | Farjad-Rad et al. | |
| 5,808,498 A | 9/1998 | Donnelly et al. | |
| 5,825,209 A | 10/1998 | Stark et al. | |
| 5,834,950 A | 11/1998 | Co et al. | |
| 5,838,631 A | 11/1998 | Mick | |
| 5,838,749 A | 11/1998 | Casper et al. | |
| 5,854,794 A | 12/1998 | Pawlowski | |
| 5,910,753 A | 6/1999 | Bogdan | |
| 5,926,041 A | 7/1999 | Duffy et al. | |
| 5,933,031 A | 8/1999 | Konno | |
| 5,936,430 A | 8/1999 | Patterson | |
| 5,939,901 A | 8/1999 | Geddes | |
| 5,950,115 A | 9/1999 | Momtaz et al. | |
| 5,953,386 A | 9/1999 | Anderson | |
| 5,955,906 A | 9/1999 | Yamaguchi | |
| 5,960,007 A | 9/1999 | Grivna | |
| 5,963,058 A | 10/1999 | Thomas | |
| 5,963,059 A | 10/1999 | Partovi et al. | |
| 5,977,801 A | 11/1999 | Boerstler | |
| 5,982,786 A | 11/1999 | Grivna | |
| 6,014,042 A | 1/2000 | Nguyen | |
| 6,026,134 A | 2/2000 | Duffy et al. | |
| 6,041,090 A | 3/2000 | Chen | |
| 6,055,286 A | 4/2000 | Wu et al. | |
| 6,060,953 A * | 5/2000 | Tsai | 331/11 |
| 6,064,235 A | 5/2000 | Hayashi et al. | |
| 6,075,388 A | 6/2000 | Dalmia | |
| 6,075,416 A | 6/2000 | Dalmia | |
| 6,081,572 A | 6/2000 | Filip | |
| 6,100,722 A | 8/2000 | Dalmia | |
| 6,147,530 A * | 11/2000 | Nogawa | 327/156 |
| 6,265,996 B1 | 7/2001 | Duffy | |
| 6,307,413 B1 | 10/2001 | Dalmia et al. | |
| 6,310,521 B1 * | 10/2001 | Dalmia | 331/11 |
| 6,366,135 B1 | 4/2002 | Dalmia et al. | |
| 6,535,527 B1 | 3/2003 | Duffy | |
| 6,940,356 B2 * | 9/2005 | McDonald et al. | 331/16 |
| 2005/0046490 A1 * | 3/2005 | Jasa et al. | 331/25 |

OTHER PUBLICATIONS

USPTO Non-Final Rejection for U.S. Appl. No. 09/471,576 (CD99062) dated Apr. 16, 2001; 3 pages.

Wang et al., "A 1Gb/s CMOS Clock and Data Recovery Circuit," 1999 IEEE International Solid-State Circuits Conference, Feb. 1999, pp. 354-355; 2 pages.

U.S. Appl. No. 09/471,915 (CD99063): "Data Frequency Detector," Dalmia et al., filed on Dec. 23, 1999; 22 pages.

U.S. Appl. No. 09/471,914 (CD99064): "Reference-Free Clock Generator and Data Recovery," Kamal Dalmia, filed on Dec. 23, 1999; 28 pages.

U.S. Appl. No. 09/470,665 (CD99065): "Digital Phase/Frequency Detector, and Clock Generator and Data Recovery PLL Containing the Same," Kamal Dalmia, filed on Dec. 23, 1999; 22 pages.

USPTO Notice of Allowance for U.S. Appl. No. 09/471,915 (CD99063) dated Oct. 19, 2001; 3 pages.

USPTO Non-Final Rejection for U.S. Appl. No. 09/471,915 (CD99063) dated Jun. 18, 2001; 4 pages.

USPTO Non-Final Rejection for U.S. Appl. No. 09/471,915 (CD99063) dated Jan. 19, 2001; 4 pages.

USPTO Notice of Allowance for U.S. Appl. No. 09/471,914 (CD99064) dated Mar. 27, 2001; 3 pages.

USPTO Non-Final Rejection for U.S. Appl. No. 09/471,914 (CD99064) dated Feb. 1, 2001; 6 pages.

USPTO Notice of Allowance for U.S. Appl. No. 09/470,665 (CD99065) dated Sep. 24, 2003; 4 pages.

USPTO Non-Final Rejection for U.S. Appl. No. 09/470,665 (CD99065) dated Apr. 25, 2003; 6 pages.

USPTO Non-Final Rejection for U.S. Appl. No. 09/470,665 (CD99065) dated Nov. 21, 2002; 4 pages.

USPTO Notice of Allowance for U.S. Appl. No. 09/283,058 (CD99004) dated Feb. 11, 2000; 1 page.

USPTO Notice of Allowance for U.S. Appl. No. 09/362,478 (CD99035) dated Mar. 28, 2000; 5 pages.

USPTO Notice of Allowance for U.S. Appl. No. 09/302,213 (CD99008) dated Feb. 9, 2000; 4 pages.

USPTO Notice of Allowance for U.S. Appl. No. 09/302,214 (CD99007) dated Oct. 31, 2000; 2 pages.

USPTO Non-Final Rejection for U.S. Appl. No. 09/302,214 (CD99007) dated Aug. 2, 2000; 4 pages.

USPTO Notice of Allowance for U.S. Appl. No. 09/347,829 (CD98083) dated Jul. 28, 2000; 1 page.

USPTO Non-Final Rejection for U.S. Appl. No. 09/347,829 (CD98083) dated Apr. 20, 2000; 4 pages.

Sheen at al., "A 3.3 V 600MHZ—1.30 GHZ CMOS Phase-Locked Loop for Clock Synchronization of Optical Chip-to-Chip interconnects," Mar. 1998, IEEE ISCAS, Circuits and Systems, vol. 4, pp. 429-432; 4 pages.

USPTO Notice of Allowance for U.S. Appl. No. 08/879,287 (CD97048) dated Dec. 21, 1998; 4 pages.

USPTO Non-Final Rejection for U.S. Appl. No. 08/879,287 (CD97048) dated Nov. 3, 1998; 5 pages.

USPTO Non-Final Rejection for U.S. Appl. No. 08/879,287 (CD97048) dated Aug. 17, 1998; 6 pages.

Yang et al., "A 0.8-um CMOS 2.5 Gb/s Oversampling Receiver and Transmitter for Serial Links," IEEE Journal of Solid-State Circuits, vol., 31, No. 12, Dec. 1996, pp. 2015-2023; 9 pages.

Chen et al., "FP 15.3: A 1.25Gb/s, 460mW CMOS Transceiver for Serial Data Communication," Feb. 1997, IEEE International Solid-State Circuits Conference, pp. 242-243, 190-191, 422; 5 pages.

Fiedler et al., "FP 15.1: A 1.0625Gbps Transceiver with 2x-Oversampling and Transmit Signal Pre-Emphasis," Feb. 1997, IEEE International Solid-State Circuits Conference, pp. 238-239, 186-187, 420; 5 pages.

U.S. Appl. No. 08/878,714 (CD97026): "Phase Locked Loop (PLL) with Linear Parallel Sampling Phase Detector," Navabi et al., filed Jun. 19, 1997; 26 pages.

Yang et al., "A 0.8-um CMOS 2.5 Gb/s Oversamped Receiver for Serial Links," IEEE Journal of Solid-State Circuits, Feb. 1996, pp. 200-201; 2 pages.

USPTO Notice of Allowance for U.S. Appl. No. 08/564,597 (CD95021) dated Jan. 16, 1997; 2 pages.

USPTO Non-Final Rejection for U.S. Appl. No. 08/564,597 (CD95021) dated Aug. 7, 1996; 4 pages.

Johnson et al., "A Variable Delay Line PLL for CPU-Coprocessor Synchronization," Oct. 1988, IEEE Journal of Solid-State Circuits, vol. 23, No. 5, pp. 1218-1223; 6 pages.

Bazes et al., "A Novel CMOS Digital Clock and Data Decoder," Dec. 1992, IEEE Journal of Solid-State Circuits, vol. 27, No. 12, pp. 1934-1940; 7 pages.

USPTO Notice of Allowance for U.S. Appl. No. 09/586,646 (CD98093C) dated Dec. 19, 2000; 3 pages.

USPTO Notice of Allowance for U.S. Appl. No. 09/216,465 (CD98093) dated Feb. 9, 2000; 4 pages.

USPTO Notice of Allowance for U.S. Appl. No. 09/302,193 (CD99024) dated Oct. 21, 2002; 7 pages.

USPTO Non-Final Rejection for U.S. Appl. No. 09/302,193 (CD99024) dated May 8, 2002; 10 pages.

USPTO Notice of Allowance for U.S. Appl. No. 09/301,900 (CD99006) dated Mar. 12, 2001; 2 pages.

USPTO Non-Final Rejection for U.S. Appl. No. 09/301,900 (CD99006) dated Nov. 28, 2000; 4 pages.

USPTO Requirement for Restriction/Election for U.S. Appl. No. 09/301,900 (CD99006) dated Aug. 23, 2000; 2 pages.

USPTO Notice of Allowance for U.S. Appl. No. 08/976,072 (CD97083) dated Jul. 6, 1999; 4 pages.

USPTO Non-Final Rejection for U.S. Appl. No. 08/976,072 (CD97083) dated May 11, 1999; 7 pages.

USPTO Notice of Allowance for U.S. Appl. No. 08/975,644 (CD97084) dated May 11, 1999; 2 pages.

USPTO Final Rejection for U.S. Appl. No. 08/975,644 (CD97084) dated May 29, 1999; 6 pages.

USPTO Non-Final Rejection for U.S. Appl. No. 08/975,644 (CD97084) dated Oct. 27, 1998; 5 pages.

Cypress HOTLink Transmitter/Receiver, CY7B923/CY7B933, Apr. 1999, pp. 1-35; 35 pages.

U.S. Appl. No. 09/301,900 (CD99006): "Low Latency, Low Power Deserializer," Michael Duffy, filed Apr. 29, 1999; 47 pages.

U.S. Appl. No. 08/976,072 (CD97083); "Circuits and Methods for Framing One or More Data Streams," Edward Grivna, filed Nov. 21, 1997; 39 pages.

U.S. Appl. No. 08/879,287 (CD97048): "Phase Detector with Linear Output Response," Navabi et al., filed Jun. 19, 1997; 14 pages.

U.S. Appl. No. 09/302,214 (CD99007): "Clock and Data Recovery PLL Based on Parallel Architecture," Kamal Dalmia, filed Apr. 29, 1999; 21 pages.

U.S. Appl. No. 09/302,213 (CD99008): "Phase Detector with Extended Linear Range," Kamal Dalmia, filed Apr. 29, 1999; 16 pages.

U.S. Appl. No. 09/216,465 (CD98093): "Phase Detector with Extended Linear Range," Dalmia et al., filed Apr. 29, 1999; 23 pages.

* cited by examiner

FAST LOCK CIRCUIT FOR A PHASE LOCK LOOP

RELATED APPLICATIONS

This application claims the benefit and priority to a provisional application Ser. No. 60/787,862, inventors Kennedy et al., entitled "A FAST LOCK CIRCUIT FOR A PHASE LOCK LOOP" that was filed on Mar. 31, 2006. The above-cited provisional application is incorporated herein in its entirety.

TECHNICAL FIELD

Embodiments of the present invention relate to the field of electronics. More particularly, embodiments of the present invention relate to a fast lock circuit for a phase lock loop.

BACKGROUND ART

A phase-locked loop (PLL) is a closed-loop feedback control system that maintains a generated signal in a fixed phase relationship to a reference signal. More importantly, the PLL is used widely in radio, telecommunications, computers and other electronic applications where it is desired to stabilize a generated signal or to detect signals in the presence of noise. For example, the PLL is widely used for synchronization purposes, in communication for coherent carrier tracking, bit synchronization and symbol synchronization for instance.

Figure 1:
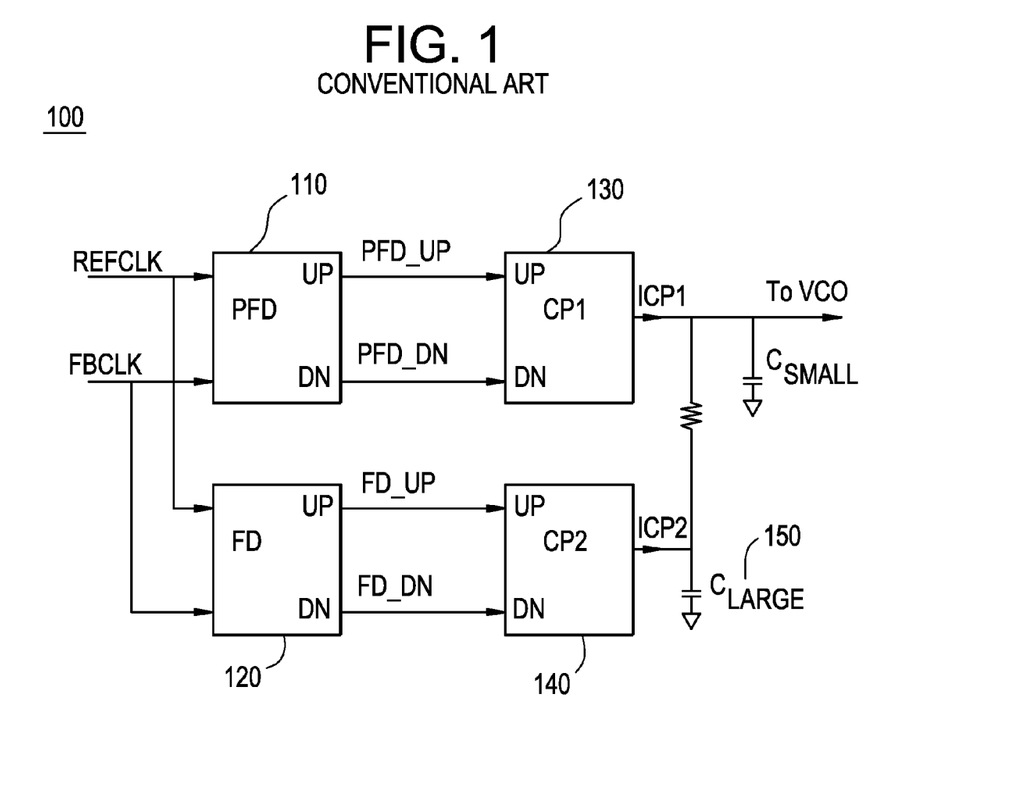
FIG. 1 shows a front end of a conventional fast lock PLL circuit.

FIG. 1 shows a fast lock circuit 100 for a PLL circuit. The fast lock circuit 100 uses the normal PLL phase frequency detector 110 and normal PLL charge pump 130 combination in the primary loop. Before the PLL circuit has achieved lock, a separate frequency detector 120 and a secondary charge pump 140 quickly charge or discharge the large loop filter capacitor 150.

Figure 2:
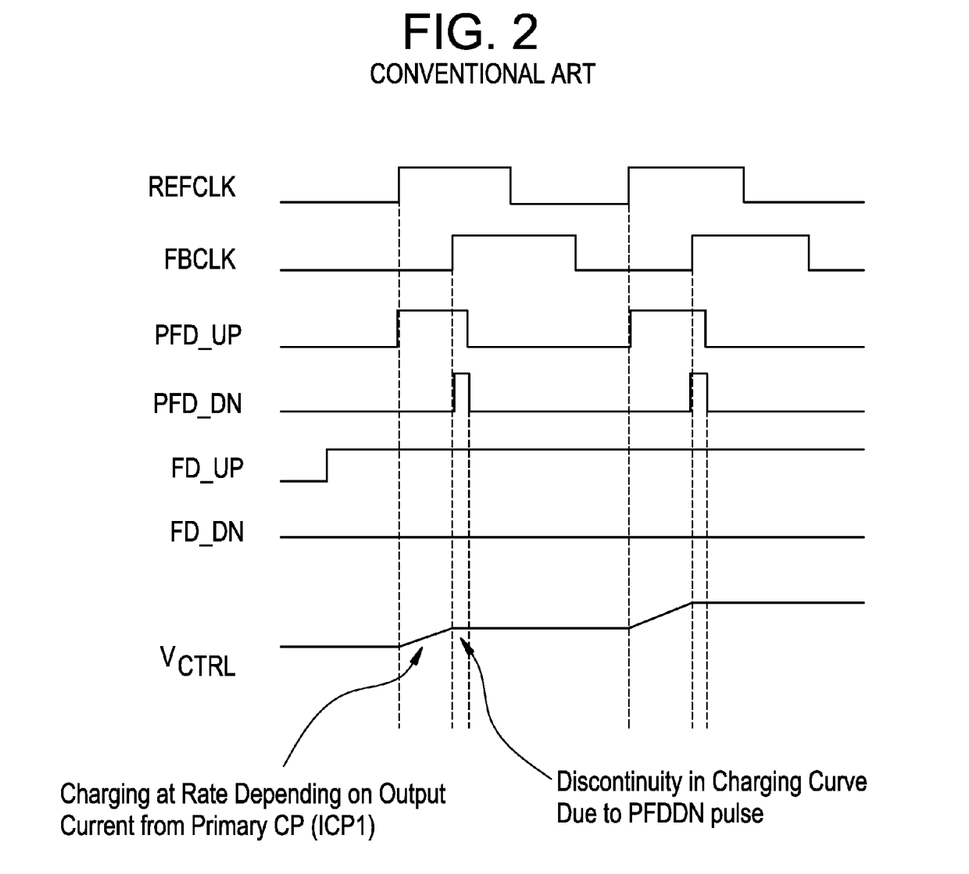
FIG. 2 shows timing diagrams for a conventional fast lock PLL circuit.

Moreover, when the PLL approaches lock, a deliberate dead zone built into the frequency detector 120 disables the secondary circuit. As a result, the phase frequency detector 110 and the charge pump 130 bring the PLL to lock. However, as the PLL approaches lock, the phase frequency detector produces a pump down signal on every period of the reference clock. The pump down signal resets the pump up signal from the phase frequency detector which slows down the net charging of the loop filter as shown in FIG. 2. As a result, the lock time increases as shown by the discontinuity of the filter charging curve of FIG. 2.

An H-bridge circuit is commonly used in charge pumps in order to maintain a constant voltage across both the current source and the current sink in the charge pump of a PLL. However, when an H-bridge is used and both phase frequency detector pulses have the same value, the current is shunted to ground. As a result, during the time that the current is not steered onto the loop filter, the current is shunted to ground and wasted because it is no longer used to charge the loop filter. As a result, the lock time increases.

SUMMARY

Accordingly, there is a need for a fast lock circuit for a PLL circuit that supplies constant current to a large loop filter capacitor in order to improve the lock time. It will become apparent to those skilled in the art in view of the detailed description of the present invention that the present invention remedies the above mentioned needs.

One embodiment of the present invention utilizes a logic circuit coupled to the phase frequency detector, frequency detector and two charge pumps. The logic circuit outputs signals from the phase frequency detector circuit when the PLL is locked. The logic circuit outputs signals from the frequency detector circuit before the PLL has achieved lock. As a result, a constant current is supplied to a large loop filter capacitor before the PLL has achieved lock. Therefore, using the novel logic circuit to supply constant current charges the large loop filter capacitor continuously and avoids a slow down in charging the large loop filter capacitor. Accordingly, current is no longer wasted and the lock time of the circuit is improved.

More specifically, an embodiment of the present invention pertains to a fast lock circuit for a phase locked loop where the circuit includes a phase frequency detection circuit operable to detect the phase and frequency of a signal and in response thereto operable to adjust first and second control output signals from the phase frequency detector for adjusting the phase and frequency of the signal; a frequency detection circuit, coupled to the phase frequency detection circuit, operable to detect a frequency of the signal and in response thereto operable to adjust a first and a second control output signals from the frequency detector for adjusting the frequency of the signal. This embodiment further includes a logic circuit coupled to the phase frequency detection circuit and further coupled to the frequency detection circuit, outputting the first and the second phase frequency detector control output signals and the first and the second frequency detector control output based on the lock status of the phase locked loop; a first charge pump coupled to the logic circuit for increasing and decreasing a first current output in response to the plurality of control signals; and a second charge pump coupled to the frequency detection circuit for increasing and decreasing a second current output in response to the frequency detection circuit.

In one embodiment, the logic circuit outputs the first and the second phase control output signals when the phase locked loop is in lock. According to one embodiment, the logic circuit outputs the first and the second frequency control output signals before the phase locked loop achieves lock.

According to one embodiment, the lock circuit further includes a second logic circuit coupled to the first charge pump for controlling the first current output before the PLL achieves lock. In one embodiment, the second logic circuit is a programmable charge pump bits. In one embodiment, the first current is maximized before the phase locked loop achieves lock.

According to one embodiment, the lock circuit further includes a second logic circuit coupled to the first charge pump for increasing the amount of the first current output before the phase locked loop achieves lock.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION

Reference will now be made in detail to embodiments of the present invention, examples of which are illustrated in the accompanying drawings. While the invention will be described in conjunction with these embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be evident to one of ordinary skill in the art that the present invention may be practiced without these specific details. In other instances, well known methods, procedures, components, and circuits have not been described in detail as not to unnecessarily obscure aspects of the invention.

A Fast Lock Circuit for a Phase Lock Loop

The preferred embodiment of the present invention utilizes logic circuit to supply constant current to a large loop filter capacitor before lock. Accordingly, the large loop filter capacitor is constantly charged without slowing down and as a result improves the lock time.

Figure 3:
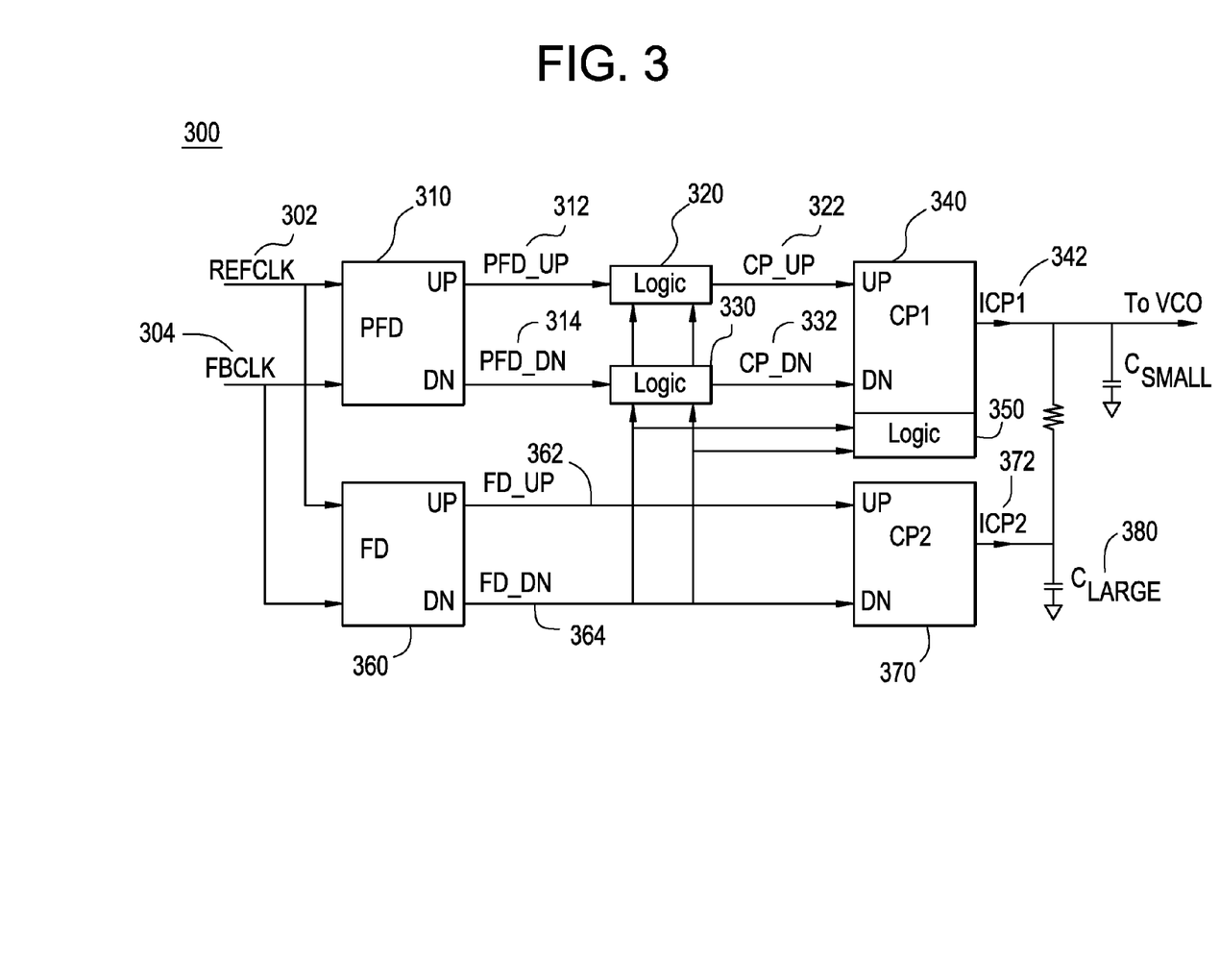
FIG. 3 shows a block diagram for a fast lock PLL circuit in accordance with one embodiment of the present invention

Referring now to FIG. 3, one embodiment of the present invention is shown. Circuit 300 comprises a phase frequency detection circuit 310 coupled to a first logic circuit 320 and a second logic circuit 330. It is appreciated that even though the first logic circuit 320 and the second logic circuit 330 are shown as separate units, they may be implemented and integrated as a single working unit. The two logic circuits 320 and 330 are further coupled to a first charge pump 340. The circuit 300 further comprises a frequency detection circuit 360 which is coupled to the first 320 and the second logic circuit 330. The frequency detection circuit 360 is further coupled to a third logic circuit 350 and a second charge pump 370. It is appreciated that even though the third logic circuit 350 is shown as a separate unit, it may be integrated to a single working unit with the first charge pump 340 or alternatively form a single working unit with logic units 320 and 330. The first charge pump 340 and the second charge pump 370 output a first current 342 and a second current 372 respectively. As a result, the two currents 342 and 372 charge the large loop filter capacitor 380.

An important part of a PLL is the phase frequency detector 310 whereby the phase of the local oscillator is compared to that of the reference signal. The two input signals to the phase frequency detector 310 are signals 302 and 304 respectively. The phase frequency detection circuit 310 outputs two signals, a first signal 312 and a second signal 314 respectively. The first signal 312 is the difference between the two input signals to the phase frequency detection circuit 310, if signal 302 arrives before 304. The second signal 314 is the difference between the two input signals to the phase frequency detection circuit 310, if signal 304 arrives before 302. Whichever signal between 312 and 314 is asserted first, will be reset by the other. The reason the second signal is asserted is to avoid a dead zone in the PLL.

Another important part of a PLL is the frequency detector 360 whereby the frequency of the local oscillator is compared to that of the reference signal. The two input signals to the frequency detection circuit 360 are signals 302 and 304 respectively. The frequency detector 360 outputs two signals, a third signal 362 and a fourth signal 364. By activating one signal and deactivating another, the frequency detector 360 adjusts the frequency of the local oscillator during the lock phase only. In other words, during the lock phase, the third and fourth signals 362 and 364 have opposing values. For example, before lock, if the third signal 362 is active, the fourth signal 364 is inactive. Conversely, before lock if the third signal 362 is inactive, the fourth signal 364 is active. When the circuit is locked, both the third and the fourth signals 362 and 364 become inactive. The second charge pump 370 is coupled to the frequency detector 360 which in response to the third and the fourth signals 362 and 364 provide a positive or negative current output signal 372.

The phase frequency detector 310 is coupled to the two logic circuits, 320 and 330 respectively. The frequency detector circuit 360 is also coupled to the two logic circuits, 320 and 330 respectively. The two logic circuits, 320 and 330 in turn are coupled to the first charge pump 340. The logic circuits 320 and 330 operate differently during the lock phase and when the PLL has locked.

During the lock phase, as discussed above, the frequency detection circuit 360 adjust its outputs, the third 362 and the fourth 364 signal in order to adjust its frequency and approach lock. Therefore, as discussed above during the lock phase, the third 362 and the fourth 364 signal have opposing values, thereby increasing or decreasing the frequency of signal 304 to achieve lock. The logic circuits 320 and 330 are coupled to the frequency detection circuit 360 and relay the third signal 362 and the fourth signal 364 from the frequency detector 360 to the first charge pump 340 during the lock phase. Consequently, the output signal 322 of the logic circuit 320 is the third signal 362 during the lock phase. Similarly, the output signal 332 of the logic circuit 330 is the fourth signal 364 during the lock phase.

In other words, during the lock phase, when the third signal 362 is active, the output signal 322 is active and the fourth signal 364 and the output signal 332 are inactive. Furthermore, during the lock phase the first 312 and the second 314 signal are no longer connected to the first charge pump 340.

As a result of mapping the third 362 and the fourth 364 signal to the output signals of the logic circuit 320 and 330 respectively, the second signal 314 will no longer slow down the charging of the large loop filter capacitor 380 even when it is activated because the second signal 314 is not mapped to the first charge pump 340 during the lock phase. Accordingly, a constant current is supplied which is the addition of the two output currents 342 and 372 from the two charge pumps 340 and 370 respectively, thereby charging up the large loop filter capacitor 380. Consequently, the lock time is reduced.

In one embodiment of the present invention, the output current 342 can be maximized during the lock phase. Maximizing output current 342 during the lock phase is achieved by coupling the logic unit 350 to the frequency detector 360 and further coupled to the first charge pump 340. As a result, the current is maximized and a constant current acts on the large loop filter capacitor 380, thereby reducing the lock time.

Figure 4:
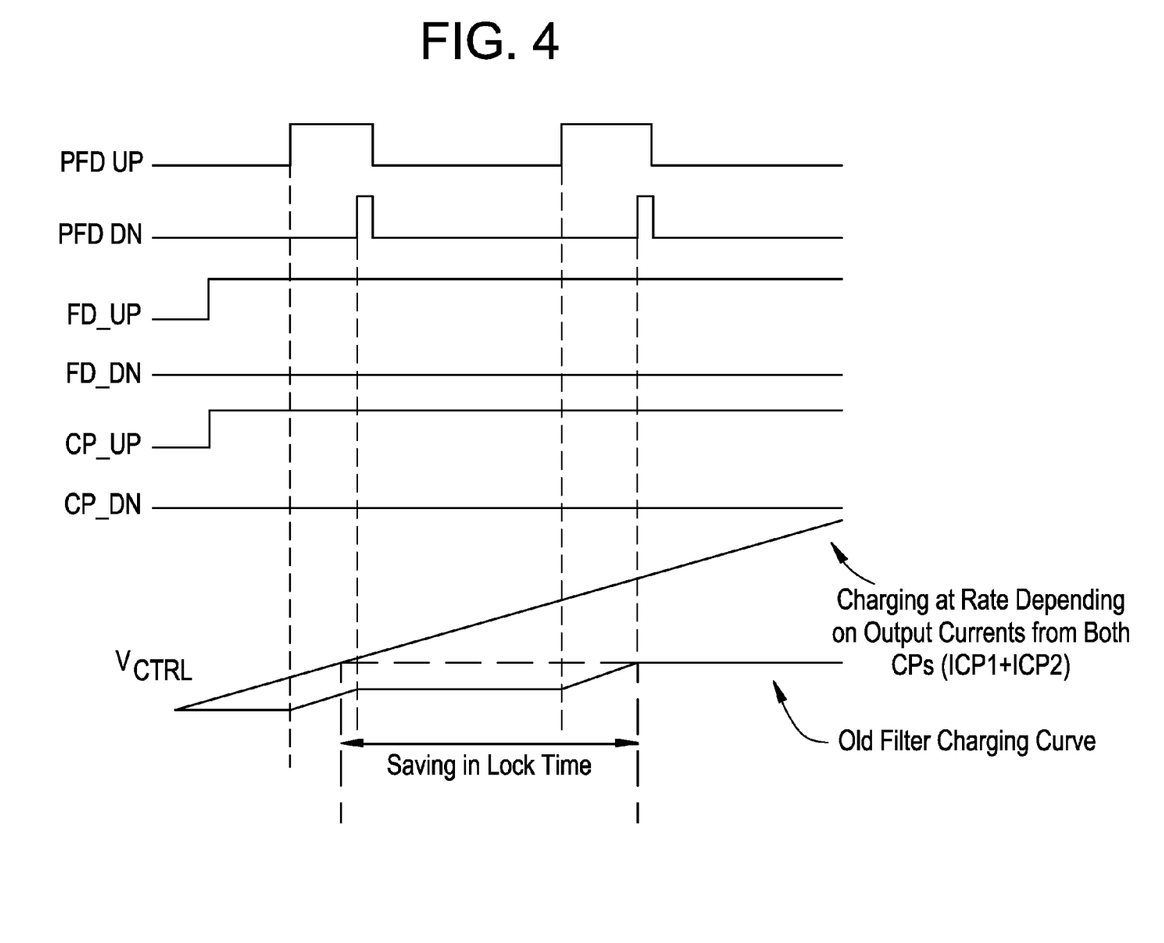
FIG. 4 shows timing diagrams before lock for a fast lock PLL circuit in accordance with one embodiment of the present invention.

Referring now to FIG. 4, the timing diagrams for one embodiment of the present invention before lock are shown. As discussed above, the two input signals 302 and 304 are input signals to the phase frequency detector 310 and the frequency detector 360. The first signal 312 is the output signal from the phase frequency detector 310 where its output is the difference between the two input signals. Moreover, the phase frequency detector 310 outputs the second signal 314 which is used to avoid a dead zone.

Referring still to FIG. 4, the output signals from the frequency detector 360 are the third 362 and the fourth 364 signal respectively. Since the circuit has not achieved lock, the third 362 and the fourth 364 signals have opposing values. For example, the third 362 signal is active while the fourth 364 signal is inactive. The logic circuits 320 and 330 map the third 362 and the fourth 364 signal to its output signals, 322 and 332 respectively. As a result, the signal 322, is active while the signal 332 is inactive. Therefore, despite the fact that the second signal 314 becomes active at the end of each cycle, the net charging rate of the large loop filter capacitor 380 is not reduced because the third 362 signal is mapped to the first charge pump 340 instead of the second signal 314. As a result, a constant current is supplied which is the addition of the two output currents 342 and 372 from the two charge pumps 340 and 370 respectively, thereby charging up the large loop filter capacitor 380. Consequently, the lock time is advantageously reduced compared to the conventional method.

Referring back to FIG. 3, when the PLL has locked, as discussed above, the third 362 and the fourth 364 signals are inactive. When in lock, the logic units 320 and 330 relay signals from the phase frequency detector 310 to the first charge pump 340. In other words, when in lock the output signal 322 of the logic circuit 320 is the first signal 312 from the phase frequency detector 310. Similarly, when in lock the output signal 332 of the logic circuit 330 is the second signal 314 from the phase frequency detector 310. In other words, the two logic circuits 320 and 330 gate the outputs of the phase frequency detector 310.

Figure 5A:
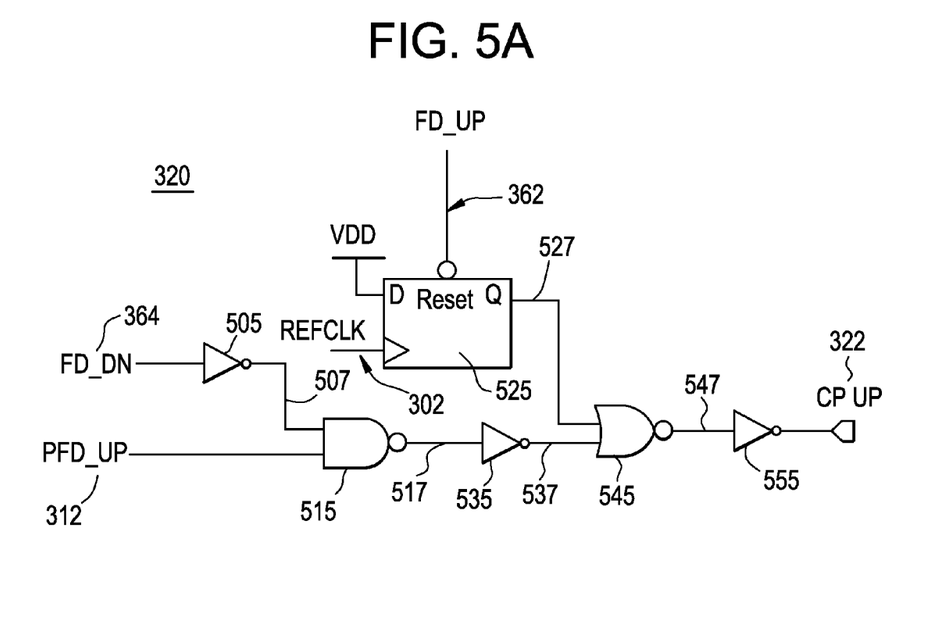
FIG. 5A shows an exemplary logic circuit for a fast lock PLL circuit in accordance with one embodiment of the present invention.

Referring now to FIG. 5A, one embodiment in accordance with the present invention for implementing the logic unit 320 is shown. It is appreciated that the logic circuit shown is for illustration and not for limitation. It is further appreciated that other electronic devices such as multiplexers may be used to implement the logic unit 320.

In this example, the fourth signal 364 is inverted by inverter 505 and inputted to NAND gate 515. The first signal 312 is also inputted to NAND gate 515. The output signal 517 of the NAND gate 515 is inverted by inverter 535, outputting inverted signal 537. The third 362 signal is coupled to the Reset input to a D-Type Flip-Flop. The D input is tied to VDD, and the clock input is coupled to the reference clock 302. The output 527 of the D-type Flip Flop 525 and the output 537 of the inverter 535 are gated to NOR gate 545. The output 547 of the NOR gate 545 is inverted by inverter 555. The output signal 322 of the inverter 555 is the output signal of the logic unit 320.

As discussed above, before lock the third 362 and the fourth 364 signals have opposing values. For example, the third 362 signal is active while the fourth 364 signal is inactive. Accordingly, the output 507 of the inverter 505 is an active signal.

As discussed above, the first signal 312 is active before the second signal 314 is active. Furthermore, when the first signal 312 is inactive, the second signal 314 can be inactive as well.

For illustration purposes it is assumed that the first signal 312 is active and the 314 signal is inactive. Inputting active signal 507 and active signal 312 to NAND gate 515, outputs inactive signal 517. Inactive signal 517 is inverted by inverter 535, outputting active signal 537. As discussed above, for illustration purposes it is assumed that the third 362 signal is active and the fourth 364 signal is inactive. Therefore, D-type Flip Flop 525 will not reset, and on every edge of the reference clock 302, VDD will be latched to the Q output thereby activating signal 527. Furthermore, gating active signal 527 and active signal 537 with NOR gate 545, outputs inactive signal 547. Inactive signal 547 is further inverted by inverter 555, resulting in active signal 322. As a result, before lock the third signal 362 is mapped to the output 322 of the logic unit 320.

Figure 5B:
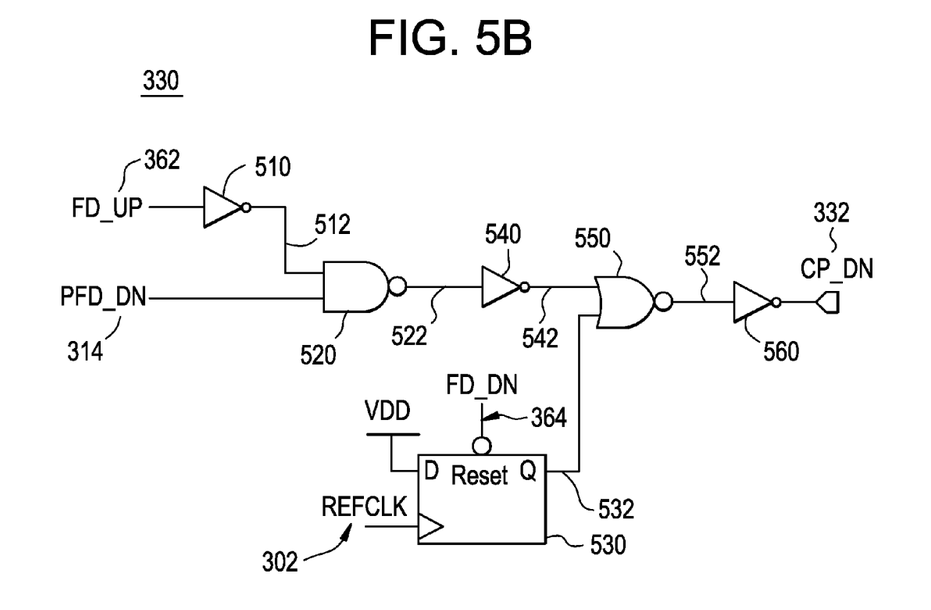
FIG. 5B shows an exemplary logic circuit for a fast lock PLL circuit in accordance with one embodiment of the present invention.

Referring now to FIG. 5B, one embodiment in accordance with the present invention for implementing logic unit 330 is shown. It is appreciated that the logic circuit shown is for illustration and not for limitation. It is further appreciated that other electronic devices such as multiplexers may be used to implement the logic unit 330.

In this example, the third 362 signal is inverted by inverter 510 and inputted to NAND gate 520. The second signal 314 is also inputted to NAND gate 520. The output signal 522 of the NAND gate 520 is inverted by inverter 540, outputting inverted signal 542. The fourth 364 signal is coupled to the Reset input of D-type Flip Flop 530. The D input is tied to VDD, and the clock input is coupled to the reference clock 302. The output 532 of the D-type Flip Flop gate 530 and the output 542 of the inverter 540 are gated to NOR gate 550. The output 552 of the NOR gate 550 is inverted by inverter 560. The output signal 332 of the inverter 560 is the output signal of the logic unit 330.

As discussed above, before lock, the third 362 and the fourth 364 signals have opposing values. For example, the third 362 signal is active while the fourth 364 signal is inactive. Accordingly, the output 512 of the inverter 510 is an inactive signal.

As discussed above, the first signal 312 is active before the second signal 314 is active. Furthermore, when the first signal 312 is inactive, the second signal 314 can be inactive as well. For illustration purposes as discussed above, it is assumed that the first signal 312 is active and the second 314 signal is inactive. Inputting inactive signal 512 and inactive second signal 314 to NAND gate 520, outputs active signal 522. Active signal 522 is inverted by inverter 540, outputting inactive signal 542 as a result. As discussed above, for illustration purposes it is assumed that the third 362 signal is active and the fourth 364 signal is inactive. Therefore, D-type Flip Flop 530 is reset and outputs inactive signal 532. Furthermore, gating inactive signal 532 and inactive signal 542 with NOR gate 550, outputs active signal 552. Active signal 552 is further inverted by inverter 560, resulting in an inactive signal 332. As a result, before lock the fourth signal 364 is mapped to the output 332 of the logic unit 330.

As discussed and shown in FIGS. 5A and 5B, before lock when the third 362 signal is active and the fourth 364 signal is inactive, the logic units 320 and 330 output active 322 and inactive 332 signals respectively. Similarly, if the third 362 signal is inactive and the fourth 364 signal is active, the logic units 320 and 330 output inactive 322 and active 332 signals respectively.

The operation of the logic circuits 320 and 330 can also be described when in lock. As discussed before, when a circuit is in lock, the third 362 and the fourth 364 signals are both inactive. Referring now to FIG. 5A, the operation of the logic 320 circuit after lock is described.

The output 507 of the inverter 505 is active because the fourth 364 signal is inactive. Moreover, as discussed above, for illustration purposes it is assumed that the first signal 312 is active and the second signal 314 is inactive. Accordingly, NAND 515 gate acts as an inverter and outputs inactive signal 517 which is inverted by inverter 535. The third 362 signal is coupled to the Reset input of D-type Flip Flop 525. As a result, D-type Flip Flop 525 outputs inactive signal 527 which is gated with signal 537 to NOR gate 545. As a result, NOR gate 545 outputs inactive signal 547 which is inverted by inverter 555. Accordingly, the output signal 322 of the logic circuit 320 is active. As such, the first 312 signal is mapped to the output signal 322 during lock.

When signal 312 is inactive, the output 517 of NAND gate 515 is active. The active signal 517 is inverted by inverter 535 to generate inactive signal 537. Signal 362 is inactive thereby inactivating signal 527. Inactive signal 527 is gated with inactive signal 537 to NOR gate 545. As a result NOR gate 545 outputs an active signal 547 which is inverted by inverter 555 to generate inactive signal 322. As such, the first 312 signal is mapped to the output signal 322 when in lock.

Referring now to FIG. 5B, the operation of the logic 330 circuit after lock is described. The output 512 of inverter 510 is active because the third 362 signal is inactive. Moreover, as discussed above, for illustration purposes it is assumed that the first signal 312 is active and the second signal 314 is inactive. Accordingly, NAND 520 gate outputs active signal 522 which is inverted by inverter 540. The fourth 364 signal is coupled to the Reset input of D-type Flip Flop 530. As a result, D-type Flip Flop 530 outputs inactive signal 532 which is gated with signal 542 to NOR gate 550. As a result, NOR gate 550 outputs active signal 552 which is inverted by inverter 560. Accordingly, the output signal 332 of the logic circuit 330 is inactive. As such, the second 314 signal is mapped to the output signal 332 during lock.

When signal 314 is active, the output 522 of NAND gate 520 is inactive. The inactive signal 522 is inverted by inverter 540 to generate active signal 542. Signal 364 is inactive thereby inactivating signal 532. Inactive signal 532 is gated with active signal 542 to the NOR gate 550 to generate inactive signal 552. Inactive signal 552 is inverted by inverter 560 to generate active signal 332. As such, the second 314 signal is mapped to the output signal 332 during lock.

Therefore, before lock the logic units 320 and 330 relay output signals form the frequency detector circuit to the first charge pump. Conversely, during lock the logic units 320 and 330 relay output signals from the phase frequency detector circuit to the first charge pump. Consequently, large loop filter capacitor is continuously charged during lock, thereby improving the lock time.

Figure 6:
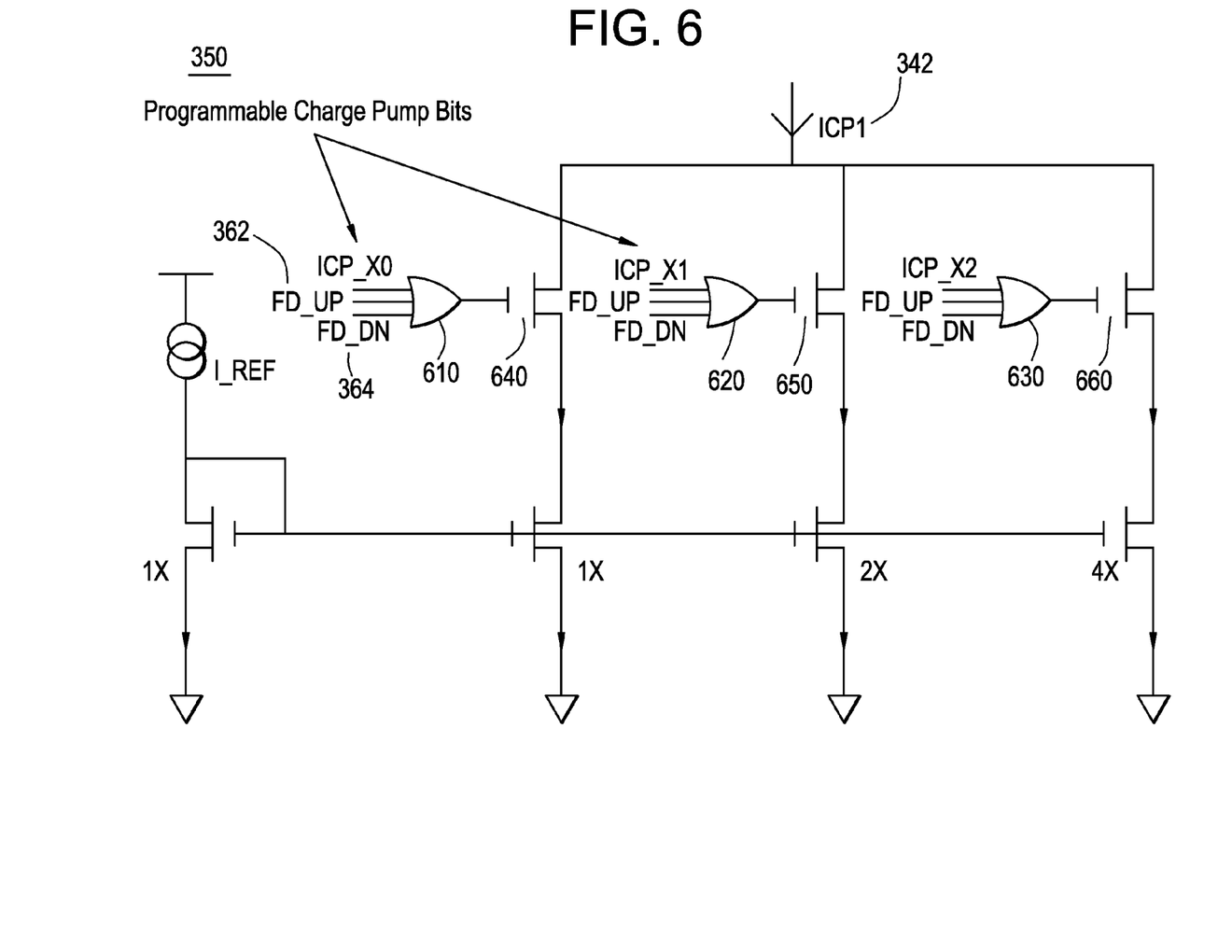
FIG. 6 shows an exemplary logic circuit for maximizing output current in accordance with one embodiment of the present invention.

Referring now to FIG. 6, programmable charge pump bits in the primary charge pump are used to maintain flexibility in PLL loop parameters such as closed loop bandwidth and long term jitter. It is desirable to maximize the current output 342 during the lock phase. Programmable charge pump bits may be used to control and vary the current. For example, when in lock as discussed above the third 362 and the fourth 364 signals are inactive. As a result, the output of the OR gates 610, 620 and 630 are controlled by the programmable charge pump bits, ICP_X0, ICP_X1 and ICP_X2. Activating and deactivating programmable charge pump bits varies the output current 342.

Moreover, as discussed above, before lock, either the third signal 362 is active and the fourth signal 364 is inactive or the third signal is inactive and the fourth signal is active. As a result, transistors 640, 650 and 660 are on, thereby maximizing the output current 342 before lock. Consequently, before lock the current is maximized, thereby charging the large loop filter capacitor 380 and speeding up the lock time.

Figure 7:
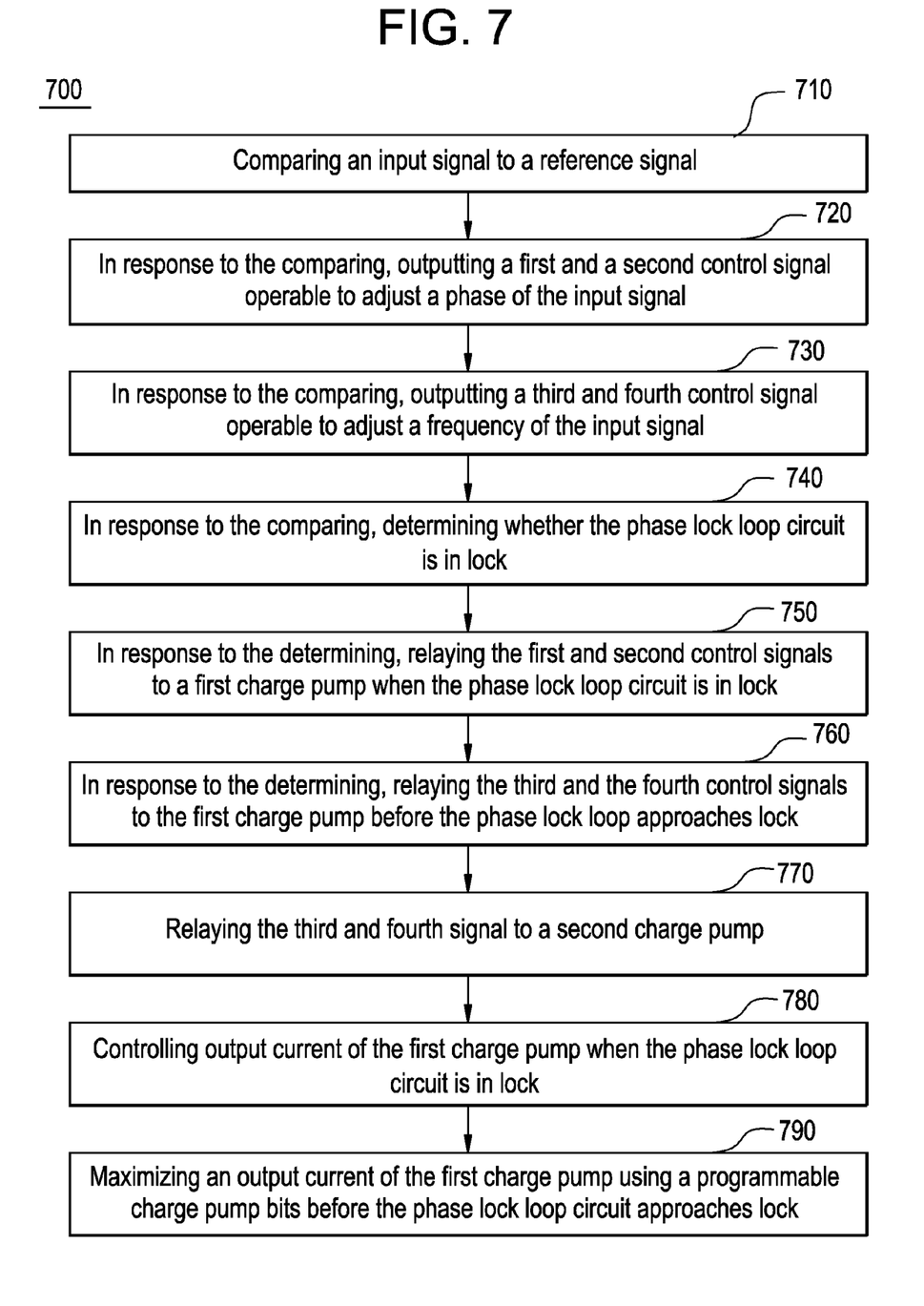
FIG. 7 shows a flow diagram of the operation of a fast lock PLL circuit in accordance with one embodiment of the present invention.

Referring now to FIG. 7, a flow diagram 700 for a fast lock PLL circuit in accordance with one embodiment of the present invention is shown. At step 710, an input signal is compared to a reference signal. At step 720, in response to the comparing, a first and a second control signal are output. The first and the second control signals are operable to control and adjust a phase of the input signal by increasing/decreasing an output current from a charge pump. At step 730, in response to the comparing, a third and a fourth control signals are output. The third and the fourth control signals are operable to control and adjust a frequency of the input signal by increasing/decreasing an output current from a charge pump. It is appreciated that in one embodiment, the charge pump for controlling the phase and the charge pump for controlling the frequency may be the same or separate. Furthermore, it is appreciated that in one embodiment, more than two charge pumps may be used.

At step 740, in response to the comparing it is determined whether the phase lock loop circuit is in lock or if it is out of lock. At step 750, in response to the determining of whether the phase lock loop circuit is in lock, the first and the second control signals are relayed to a first charge pump when the phase lock loop circuit is in lock. At step 760, in response to the determining of whether the phase lock loop circuit is in lock, the third and the fourth control signals are relayed to the first charge pump before the phase lock loop achieves lock. At step 770, the third and the fourth signals are relayed to a second charge pump regardless of whether the phase lock loop is in lock.

According to one embodiment, at step 780 an output current of the first charge pump is controlled when the phase lock loop is not in lock (e.g., using programmable charge pump bits). According to one embodiment, at step 790 the output current of the first charge pump is maximized before the phase lock loop circuit achieves lock such that the time required to achieve lock is reduced.

Accordingly, embodiments of the present invention reduce or eliminate a slow down in the charging of the large loop filter capacitor before lock by gating the frequency detector and the phase frequency detector with logic circuits as described. As a result, a constant supply of current is provided to the large loop filter capacitor. Therefore, supplying constant current eliminates a slow down in charging, thereby improving the lock time.

In the foregoing specification, embodiments of the invention have been described with reference to numerous specific details that may vary from implementation to implementation. Thus, the sole and exclusive indicator of what is, and is intended by the applicants to be, the invention is the set of claims that issue from this application, in the specific form in which such claims issue, including any subsequent correction. Hence, no limitation, element, property, feature, advantage or attribute that is not expressly recited in a claim should limit the scope of such claim in any way. The specification and drawings are, accordingly, to be regarded in an illustrative rather than a restrictive sense.

What is claimed is:

1. A lock circuit for a phase lock loop, said circuit comprising:
a phase frequency detection circuit operable to detect individual phases and individual frequencies of an input signal and in response thereto operable to adjust first and second phase control output signals for adjusting one or more of said individual phases and individual frequencies of said input signal;

a frequency detection circuit coupled to said phase frequency detection circuit and operable to detect individual frequencies of said input signal and in response thereto operable to adjust first and second frequency control output signals for adjusting at least one of said frequencies of said input signal;

a logic circuit coupled to said phase frequency detection circuit and further coupled to said frequency detection circuit and operable to output said first and second phase control output signals and said first and second frequency control output signals based on a lock status of said phase locked loop;

a first charge pump coupled to said logic circuit for increasing and decreasing a first current output in response to one or both of said first and second phase control output signals from said phase frequency detection circuit and one or both of said first and second frequency control output signals from said frequency detection circuit; and a second charge pump coupled to said frequency detection circuit for increasing and decreasing a second current output in response to said frequency detection circuit, wherein said first and second frequency control output signals are relayed to the second charge pump regardless of whether the phase lock loop is in lock.

2. The lock circuit as described in claim 1 wherein said logic circuit outputs said first and second phase and frequency control output signals when said phase lock loop is in lock.

3. The lock circuit as described in claim 1 wherein said logic circuit outputs said first and second frequency control output signals before said phase lock loop achieves lock.

4. The lock circuit as described in claim 1 further comprising:
a second logic circuit coupled to said first charge pump for controlling said first current output before said phase lock loop is in lock.

5. The lock circuit as described in claim 4 wherein said second logic circuit is operable to control programmable charge pump bits.

6. The lock circuit as described in claim 4 wherein said first current output is maximized before said phase lock loop approaches lock.

7. The lock circuit as described in claim 1 further comprising:
a second logic circuit coupled to said first charge pump for increasing said first current output before said phase lock loop achieves lock.

8. A circuit operable within a phase lock loop circuit, said circuit comprising:
a first charge pump;
a second charge pump;
a phase frequency detector generating first and second control signals;
a frequency detector generating third and fourth control signals for controlling said second charge pump, wherein said third and fourth control signals are relayed to the second charge pump regardless of a lock status of the phase lock loop circuit; and
a gating logic operable to gate one pair of said first and second signals and said third and fourth signals to said first charge pump based on a lock status of said phase locked loop, wherein said gating logic is further operable to control said charge pumps to supply a substantially constant current before said phase lock loop circuit achieves lock.

9. A circuit as described in claim 8 further comprising a voltage controlled oscillator coupled to said charge pumps and coupled in feedback to said detectors.

10. A circuit as described in claim 8 wherein said gating logic is further operable to drive said third and said fourth signals to said first charge pump when one of said third and said fourth signals is asserted high.

11. A circuit as described in claim 10 wherein said gating logic is further operable to decouple said first and said second control signals from said charge pumps when one of said third and said fourth signals is active.

12. A circuit as described in claim 8 further comprising a comparator to compare an input signal to said circuit with a reference signal and in response thereto for outputting said first, said second, said third and said fourth control signals.

13. A circuit as described in claim 8 further comprising:
a second gating logic for controlling a current output from said first charge pump when said phase lock loop circuit is in lock.

14. A circuit as described in claim 13, wherein said second gating logic is operable to control programmable charge pump bits.

15. A circuit as described in claim 13, wherein said current output from said first charge pump is maximized before said phase lock loop circuit approaches lock.

16. A method of achieving lock in a phase lock loop circuit, said method comprising:
comparing an input signal to a reference signal;
in response to said comparing, outputting first and second control signals operable to adjust a phase and frequency of said input signal;
in response to said comparing, outputting third and fourth control signals operable to adjust a frequency of said input signal;
in response to said comparing, determining whether said phase lock loop circuit is in lock;
in response to said determining, relaying said first and said second control signals to a first charge pump when said phase lock loop circuit is in lock and relaying said third and fourth control signals to said first charge pump before said phase lock loop circuit is in lock; and
relaying said third and said fourth control signals to a second charge pump.

17. A method as described in claim 16 further comprising:
controlling output current of said first charge pump when said phase lock loop circuit is in lock.

18. A method as described in claim 16 further comprising:
maximizing an output current of said first charge pump using programmable charge pump bits before said phase lock loop circuit approaches lock.

19. A method as described in claim 16 further comprising:
relaying said third and said fourth control signals to the second charge pump regardless of whether the phase lock loop circuit is in lock.

* * * * *